United States Patent
Kim et al.

(10) Patent No.: US 7,868,546 B2
(45) Date of Patent: Jan. 11, 2011

(54) ORGANIC LIGHT EMITTING DISPLAY DEVICE AND METHOD OF MANUFACTURING THE SAME

(75) Inventors: Won-Jong Kim, Suwon-si (KR); Jong-Hyuk Lee, Suwon-si (KR); Yoon-Hyeung Cho, Suwon-si (KR); Min-Ho Oh, Suwon-si (KR); Jin-Baek Choi, Suwon-si (KR); Byoung-Duk Lee, Suwon-si (KR)

(73) Assignee: Samsung Mobile Display Co., Ltd. (KR)

( * ) Notice: Subject to any disclaimer, the term of this patent is extended or adjusted under 35 U.S.C. 154(b) by 743 days.

(21) Appl. No.: 11/391,122

(22) Filed: Mar. 28, 2006

(65) Prior Publication Data

US 2006/0220549 A1 Oct. 5, 2006

(30) Foreign Application Priority Data

Mar. 30, 2005 (KR) .................... 10-2005-0026502

(51) Int. Cl.
*H01J 1/62* (2006.01)
(52) U.S. Cl. .................... 313/512; 438/200; 428/411.1
(58) Field of Classification Search ......... 313/501–512, 313/492; 438/200; 34/472; 428/411.1
See application file for complete search history.

(56) References Cited

U.S. PATENT DOCUMENTS

| 6,226,890 B1 * | 5/2001 | Boroson et al. ............... 34/472 |
|---|---|---|
| 6,638,624 B2 * | 10/2003 | Ozawa .................... 428/411.1 |
| 6,740,145 B2 * | 5/2004 | Boroson et al. .............. 96/108 |
| 2003/0127969 A1 * | 7/2003 | Aoki et al. .................. 313/503 |
| 2003/0190546 A1 * | 10/2003 | Yoshino et al. ............. 430/124 |
| 2003/0203551 A1 * | 10/2003 | Cok et al. ................... 438/200 |
| 2005/0218795 A1 | 10/2005 | Lee et al. |
| 2006/0038478 A1 * | 2/2006 | Moon et al. ................. 313/492 |

FOREIGN PATENT DOCUMENTS

| EP | 01143539 | 10/2001 |
|---|---|---|
| EP | 1 164 644 A2 | 12/2001 |

(Continued)

OTHER PUBLICATIONS

English Translation of JP 2004-311345.*

(Continued)

*Primary Examiner*—Nimeshkumar D Patel
*Assistant Examiner*—Mary Ellen Bowman
(74) *Attorney, Agent, or Firm*—Knobbe Martens Olson & Bear LLP

(57) ABSTRACT

Provided are an organic light emitting display device including a transparent moisture absorption layer formed of at least one of a metal oxide and metal salt having an average particle diameter of 100 nm or less, a binder, and a selective light absorber absorbing light of a wavelength of a specific range, and a method of manufacturing the same. The transparent absorbing layer further contains a dispersant. The organic light emitting display device including the transparent moisture absorption layer has an excellent moisture absorption capability compared to a conventional organic light emitting display device including a getter, and is transparent. Therefore, the organic light emitting display device has desired lifetime characteristics and improved color purity and contrast characteristics.

30 Claims, 2 Drawing Sheets

FOREIGN PATENT DOCUMENTS

| | | |
|---|---|---|
| JP | 11038918 | 2/1999 |
| JP | 2001-217072 | 8/2001 |
| JP | 2001-288467 | 10/2001 |
| JP | 2003-264061 | 9/2003 |
| JP | 2003317934 | 11/2003 |
| JP | 2004-079208 | 3/2004 |
| JP | 2004311345 | 11/2004 |
| JP | 2004311345 A * | 11/2004 |
| JP | 2004-361733 | 12/2004 |
| JP | 2005-050668 | 2/2005 |
| JP | 2005037890 | 2/2005 |
| JP | 2005050597 | 2/2005 |
| JP | 2005070318 | 3/2005 |
| KR | 10-2004-0087937 A | 10/2004 |

OTHER PUBLICATIONS

Office Action, mailed May 7, 2009 by JPO for JP Pat App 2006-081633.

Chinese Office Action issued Dec. 25, 2009 regarding Application No. 2006-10-0669336.

* cited by examiner

ORGANIC LIGHT EMITTING DISPLAY DEVICE AND METHOD OF MANUFACTURING THE SAME

CROSS-REFERENCE TO RELATED PATENT APPLICATIONS

This application claims the benefit of Korean Patent Application No. 10-2005-0026502, filed on Mar. 30, 2005, in the Korean Intellectual Property Office, the disclosure of which is incorporated herein by reference in its entirety.

BACKGROUND OF THE INVENTION

1. Field of the Invention

The present invention relates to a display device, and more particularly, to an organic light emitting display device.

2. Description of the Related Art

Organic light emitting display devices may deteriorate when moisture permeates into the devices and contacts certain components of the devices. Accordingly, a sealing is required to produce organic light emitting display devices that operate stably and have desired lifetimes.

Conventionally, metal or glass is processed into a cap-like form having a groove, and then the groove is filled with a moisture absorption agent in the form of a powder or film. The moisture absorption agent film is then attached to the groove using a double-sided tape.

Japanese Patent Laid-open Publication No. hei 9-148066 discloses an organic light emitting display device including a stacked structure in which an organic emission material layer formed of an organic compound is interposed between a pair of electrodes that face each other, a sealing container that isolates the stacked structure from an external atmosphere, and a moisture absorption agent, such as alkali metal oxide, alkali-earth metal salt, or the like, inside the sealing container. However, such an organic light emitting display device has a large thickness due to the shape of the sealing container. In addition, although the moisture absorption material exists in a solid state after it absorbs moisture, it is opaque, which is not suitable for a top emission type organic light emitting display device.

U.S. Pat. No. 6,226,890 discloses an organic light emitting display device including a moisture absorption layer formed of a binder and a moisture absorption agent including solid particles having a particle diameter of 0.1 to 200 µm. In this case, however, the organic light emitting display device cannot be applied to a top emission type organic light emitting display device because of its semitransparent or opaque characteristics, and its the moisture absorption capability, color purity, and contrast characteristics are insufficient.

SUMMARY OF CERTAIN INVENTIVE ASPECTS

One aspect of the invention provides a light emitting display device, which may comprise: a first substrate having a first interior surface; an array of light emitting units formed on the first interior surface, the array having a top surface facing away from the first substrate; a second substrate placed over the first substrate and the array, the second substrate having a second interior surface, which faces the first substrate; and a desiccant layer placed between the first and second substrate, the desiccant layer comprising a desiccant, wherein the desiccant layer is substantially transparent with respect to visible light.

In the foregoing device, the desiccant layer may further comprise a selective light absorber selectively absorbing light of a wavelength of 410 nm or 490 nm, or one or more wavelengths within the range of 570-590 nm. The selective light absorber may have in a particulate form having an average particle diameter from about 30 to about 50 nm. The amount of the selective absorber may be in the range of from about 0.1 to about 200 parts by weight based on 100 parts by weight of the desiccant. The selective light absorber may comprise at least one compound selected from the group consisting of a porphyrin-based compound, a pyromethene-based compound, a cyanine-based compound, a satural absorber phenothiazine-based compound and an azaporphyrin-based compound.

The desiccant layer may be formed on at least one of the second interior surface and the top surface with or without an intervening material between the desiccant and the second interior surface or between the desiccant and the top surface. The desiccant layer may be arranged in a location such that at least part of light emitted from the array pass through the desiccant layer. The array of light emitting units may comprise a plurality of organic light emitting diodes, wherein each organic light emitting diode may comprise a first electrode, a second electrode and an emissive layer located between the first and second electrodes, and wherein at least one of the first and second electrodes may be substantially transparent.

Still in the foregoing device, the device further comprises a plurality of side walls interconnecting with the first and second substrates, and the desiccant layer may be formed on one or more of the plurality of side walls. The desiccant may comprise at least one of a metal oxide and a metal salt. The at least one of the metal oxide and the metal salt may be in a particulate form having an average particle diameter of about 100 nm or less. The at least one of the metal oxide and the metal salt may comprise at least one selected from the group consisting of alkali metal oxides, alkali-earth metal oxides, metal halides, metal sulfates and metal perchlorates. The metal oxide may comprise CaO.

Further in the foregoing device, the desiccant layer may further comprise a dispersant in an amount sufficient to substantially uniformly disperse the desiccant within the desiccant layer. The desiccant layer may further comprise at least one binder selected from the group consisting of an organic binder, an inorganic binder, and an organic/inorganic complex binder, and the at least one binder may be in an amount from about 10 to about 5000 parts by weight based on 100 parts by weight of the desiccant. The desiccant layer has a thickness from about 0.1 to about 300 µm. The desiccant layer transmits over about 90% of visible light incident thereto. The desiccant layer transmits from about 95 to about 98% of visible light incident thereto. The desiccant layer absorbs moisture at a rate from about 30 to about 50%.

Another aspect of the invention provides a method of manufacturing a light emitting display device. The method comprises: providing a first substrate having a first interior surface; forming an array of organic light emitting units on the first interior surface, the array having a top surface facing away from the first substrate; placing a second substrate over the first substrate and the array, the second substrate having a second interior surface, which faces the first substrate; interconnecting the first and second substrates with a plurality of side walls, thereby forming an enclosed space; and prior to interconnecting, forming a desiccant layer in a place to be enclosed within the enclosed space, the desiccant layer comprising a desiccant, wherein the desiccant layer may be substantially transparent with respect to visible light. The desiccant layer may further comprise a selective light absorber selectively absorbing light of a wavelength of 410 nm or 490 nm, or a wavelength within the range of 570-590 nm.

Still another aspect of the invention provides a method of operating a light emitting display device. The method comprises: providing the above-described light emitting display device; and emitting visible light from at least part of the light emitting units, thereby displaying a visible image on at least one of the first and second substrates. In the method, at least part of the visible light emitted from the at least part of the light emitting units may pass through the desiccant layer. The visible image may be displayed on the second substrate.

A further aspect of the present invention provides an organic light emitting display device including a transparent moisture absorption layer that has excellent moisture absorption properties and is transparent, and thus suitable for a top emission type organic light emitting display device. Further the moisture absorption layer may enhance color purity and contrast characteristics with a selective light absorber included therein.

According to an aspect of the present invention, an organic light emitting display device includes: a substrate; an encapsulation substrate that is coupled with the substrate to seal a space therebetween; an organic light emitting unit that is disposed in the space between the substrate and the encapsulation substrate and includes: a first electrode; a second electrode; and an organic layer interposed between the first electrode and the second electrode; and a transparent moisture absorption layer that is disposed in the space between the substrate and the encapsulation substrate and includes: at least one of a metal oxide and a metal salt having an average particle diameter of 100 nm or less; a binder; and a selective light absorber. The transparent moisture absorption layer may further contain a dispersant.

According to another aspect of the present invention, a method of manufacturing an organic light emitting display device includes: preparing on a substrate with an organic light emitting unit comprising a first electrode, an organic layer, and a second electrode stacked sequentially on the substrate; coating a transparent moisture absorption layer forming composition comprising at least one of a metal oxide and a metal salt having an average particle diameter of 100 nm, a binder, a selective light absorber, and a solvent in an inner space between the substrate and an encapsulation substrate; and curing the coated transparent moisture absorption layer forming composition to obtain a transparent moisture absorption layer; coating a sealant on at least one side of the substrate and the encapsulation substrate outside the organic light emitting unit; and coupling the substrate and the encapsulation substrate. The transparent moisture absorption layer forming composition may further contain 1-100 parts by weight of a dispersant based on 100 parts by weight of the at least one of metal oxide and metal salt.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS

Figure 1:
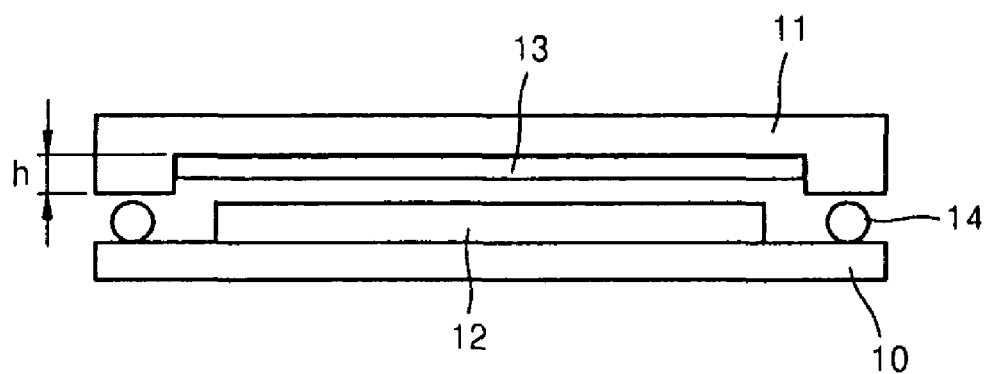
FIGS. 1 through 4 are schematic views illustrating organic light emitting display devices according to embodiments of the present invention.

Hereinafter, various features of the present invention will be described in detail in terms of embodiments and examples with reference to the accompanied drawings.

An organic light emitting display device according to an embodiment of the present invention includes a transparent moisture absorption layer or a transparent desiccant layer suitable for a top emission type organic light emitting display device, although not limited thereto. In one embodiment, the transparent moisture absorption layer contains a desiccant, which includes at least one of a metal oxide and a metal salt having an average diameter of 100 nm or less, a binder, and a selective light absorber that absorbs light of a wavelength of a predetermined range. When needed, the transparent moisture absorption layer may further contain a dispersant.

In one embodiment, the selective light absorber is a colorant, such as a pigment, a dye, or the like, and is contained in the transparent moisture absorption layer to improve color purity and contrast based on main peaks of blue (about 450 nm), green (about 550 nm), and red (about 630 nm). The selective light absorber can selectively absorb light with a wavelength of about 410 nm, about 490 nm, or light with a wavelength within the range of about 570 to about 590 nm.

In embodiments, a selective light absorber used in an embodiment of the present invention may include at least one of a porphyrin-based compound, a pyromethene-based compound, a cyanine-based compound, a satural absorber phenothiazine-based compound, and an azaporphyrin-based compound.

Examples of the phorphyrin-based compound include ematinporcin, hemoglobin-horse, and the like, which absorb light of a wavelength of about 410 nm. Examples of the pyromethene-based compound include 1,3,5,7,8-pentamethyl pyromethen difluoroborate complex [pyromethene (546)], 1,2,3,5,6,7-hexamethyl-8-cyanopyromethen-difluoroborate [pyromethene (650)], and the like. The 1,3,5,7,8-pentamethyl pyromethen difluoroborate complex absorbs light of a wavelength of about 480 nm. The 1,2,3,5,6,7-hexamethyl-8-cyanopyromethen-difluoroborate absorbs light having a wavelength of 570-590 nm. Examples of the cyanine-based compound include 3-ethyl-2-[5-(3-ethyl-2-(3H)-benzooxazolidene)-1,3-pentadienyl]-benzooxazolium iodide (DODCI), DQOCI, DQTCI, and the like. The cyanine-based compound, the satural absorber phenothiazine-based compound, and the azaporphyrin-based compound absorb light of 570-590 nm.

The amount of the selective light absorber may be in the range of from about 0.1 to about 200 parts by weight based on 100 parts by weight of the desiccant, which includes at least one of the metal oxide and metal salt. In addition, in some embodiments, the selective light absorber completely dissolves in an organic binder or an organic and inorganic complex binder, thereby attaining transparent characteristics.

Metal oxide or metal salt contained in the transparent moisture absorption layer according to an embodiment of the present invention has particles having an average diameter of about 100 nm or less. For example, the average diameter of the transparent moisture absorption layer particles may be in the range of about 50 to about 90 nm. The metal oxide or the metal salt may include at least one of an alkali metal oxide, an alkali-earth metal oxide, a metal halide, a metal sulfate, and a metal perchlorate. The alkali metal oxide may be $Li_2O$, $Na_2O$ or $K_2O$; the alkali-earth metal oxide may be BaO, CaO, or MgO; the metal sulfate may be $Li_2SO_4$, $Na_2SO_4$, $CaSO_4$, $MgSO_4$, $CoSO_4$, $Ga_2(SO_4)_3$, $Ti(SO_4)_2$, or $NiSO_4$; the metal halide may be $CaCl_2$, $MgCl_2$, $SrCl_2$, $YCl_2$, $CuCl_2$, $CsF$, $TaF_5$, $NbF_5$, $LiBr$, $CaBr_3$, $CeBr_4$, $SeBr_2$, $VBr_2$, $MgBr_2$, $BaI_2$, or $MgI_2$; and the metal perchlorate may be $Ba(ClO_4)_2$ or $Mg(ClO_4)_2$.

In embodiments of the invention, the binder may be an organic binder, an inorganic binder, an organic/inorganic complex binder, or a mixture of these. The organic binder may have a low molecular weight molecule or a high molecular weight molecule, and can be easily mixed with the metal oxide or metal salt to form a film. The organic binder having most of these properties may include at least one of an acryl-based resin, a metacryl-based resin, a polyisoprene, a vinyl-based resin, an epoxy-based resin, a urethane-based resin, and a cellulose-based resin. The acryl-based resin may be butylacrylate, ethylhexylacrylate, or the like. The metacryl-based resin may be propyleneglycolmetacrylate, tetrahydrofurfuryl metacrylate, or the like. The vinyl-based resin may be vinylacetate, N-vinylpyrrolidone, or the like. The epoxy-based resin may be cycloaliphatic epoxide, or the like. The urethane-based resin may be a urethane acrylate, or the like. The cellulose-based resin may be celluose nitrate, or the like.

In embodiments of the invention, the inorganic binder is a metallic or non-metallic material, such as silicon, aluminum, titanium or zirconium, and can be easily mixed with the metal oxide or the metal salt to form a film. For example, the inorganic binder may contain at least one of titania, silicon oxide, zirconia, alumina, and precursors of these.

The organic/inorganic complex binder is a material, in which a metallic or non-metallic material, such as silicon, aluminum, titanium, zirconium, or the like, is covalently bonded with an organic material, and can be easily mixed with the metal oxide or the metal salt to form a film. For example, the organic/inorganic complex binder may contain at least one of epoxy silane or a derivative thereof, vinyl silane or a derivative thereof, an amine silane or a derivative thereof, a metacrylate silane or a derivative thereof, or a partially cured product thereof. The partially cured product thereof may be used when a physical property of the composition, such as viscosity, need to be controlled.

The epoxy silane or a derivative thereof may be 3-glycidoxypropyltrimethoxysilane, or a polymer thereof. The vinyl silane or a derivative thereof may be vinyltriethoxysilane or a polymer thereof. The amine silane or a derivative thereof may be 3-aminopropyltriethoxysilnae or a polymer thereof. The metacrylate silane or a derivative thereof may be 3-(trimethoxysilyl)propyl acrylate or a polymer thereof. In an embodiment of the present invention, the binder may have excellent thixotropy, which is suitable for printing, and have excellent leveling properties.

A dispersant used in an embodiment of the present invention increases dispersibility when the moisture absorption dispersant is mixed with a binder included in a transparent moisture absorption layer. The dispersant may be a low molecular weight organic dispersant, a high molecular weight organic dispersant, a low molecular weight organic/inorganic complex dispersant, a high molecular weight organic/inorganic complex dispersant, an organic/inorganic acid, or the like. When such a dispersant is used, the metal oxide particles, such as CaO, in the transparent moisture absorption layer may be on the order of nm. The dispersant is to disperse the metal oxide particles well in the transparent moisture absorption layer during its formation, for example, by avoiding aggregation, and thus to make the metal oxide particles exist on the order of nm in the final transparent moisture absorption layer.

To disperse the fine particles in the solution without aggregation and precipitation, two exemplary methods can be used. In the first method, surfaces of the particles are positively or negatively charged and, due to electrostatic repulsive forces between the charged particles, the aggregation of the particles can be prevented. In this method, the particles can be easily dispersed in the solution, and if the particles are required to have electrical properties, the particles can be dispersed without changing the electrical properties of the particles. However, in some situations, the electrical repulsive forces may not be strong enough, and may be greatly affected by the pH of the solution.

In the second method, the particles to be dispersed are surrounded by high molecular weight dispersants, and due to steric hindrance between them, the particles are not aggregated. In this method, a wide range of solvents can be used regardless of their polarity and dispersion stability is high. However, particles having electrical properties may not be used in this method and the dispersant may be expensive. The dispersant of the moisture absorption dispersion used in an embodiment of the present invention has a high molecular weight, and thus, when the dispersant is mixed with the binder, the dispersibility can be maintained and the solution can be uniformly mixed.

With the binder and the dispersant described above, a transparent moisture absorption layer can be formed to a great thickness, and the amount of the nano-size moisture absorption impregnated in the transparent moisture absorption layer can be increased to absorb more moisture. Even if the moisture absorption layer is thick, such as 100 µm or greater, the moisture absorption layer can maintain its high transparency by selecting an appropriate binder. Furthermore, the viscosity of the composition for the transparent moisture absorption layer can be properly controlled by using a binder, and thus, a transparent moisture absorption layer can be formed using a number of different methods including a printing method.

Figure 3:
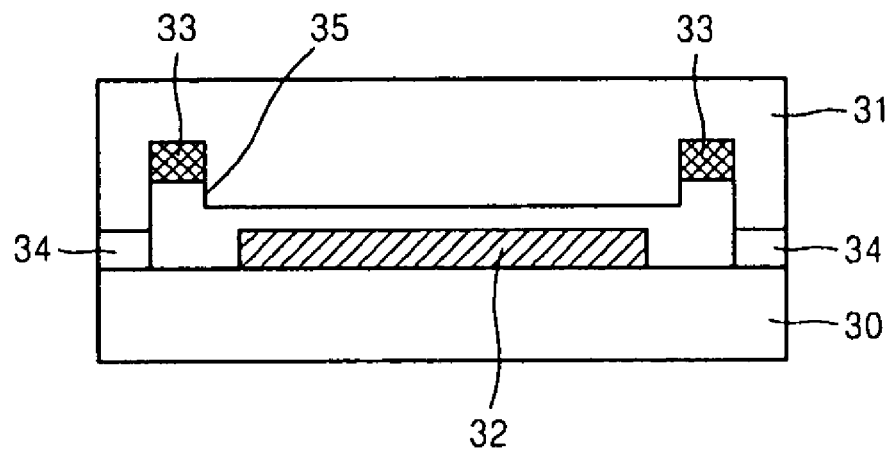
Figure 4:
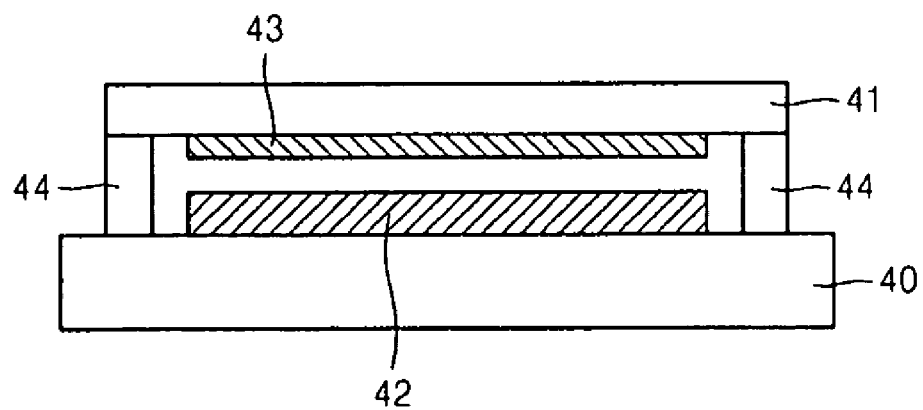

In an organic light emitting display device according to an embodiment of the present invention, the transparent moisture absorption layer may be disposed in a space between the substrate and an encapsulation substrate. In particular, the transparent moisture absorption layer may be formed on an inner surface of the encapsulation substrate as illustrated in FIGS. 1 and 4, on a side surface of a sealant layer as illustrated in FIG. 2, or on at least one side of the substrate and the encapsulation substrate (for example, in a groove portion of the substrate as illustrated in FIG. 3.)

FIG. 1 is a schematic view of an organic light emitting display device according to an embodiment of the present invention. Referring to FIG. 1, the organic light emitting display device includes a substrate 10 formed of glass or a transparent insulating material, an organic light emitting unit 12 disposed on a surface of the substrate 10 and including a first electrode, an organic layer, and a second electrode sequentially layered, an encapsulation substrate 11 combined with the substrate 10 to seal an internal space between the substrate 10 and the encapsulation substrate 11, in which the organic light emitting unit 12 is contained, and a transparent moisture absorption layer 13 formed on an inner surface of the encapsulation substrate 11.

In the illustrated embodiment, the encapsulation substrate 11 may be formed by an etching a central portion of a glass. The etching of the glass produces an inner surface surrounded by side walls. The transparent moisture absorption layer 13 is formed on the inner surface of the glass. An etching depth h of the glass may vary among embodiments. For example, the etching depth h of the etching glass may be in the range of about 100 to about 300 µm, and the thickness of the transparent moisture absorption layer 13 may be in the range of about 0.1 to about 300 µm. The substrate 10 is coupled with the encapsulation substrate 11 by one or more sealant layers 14 coated outside the organic light emitting unit 12. In this case, the encapsulation substrate 11 is coupled with the substrate 10 to substantially water-impermeably encapsulate the organic light emitting unit 12 interposed between the encapsulation substrate 11 and the substrate 10.

Figure 2:
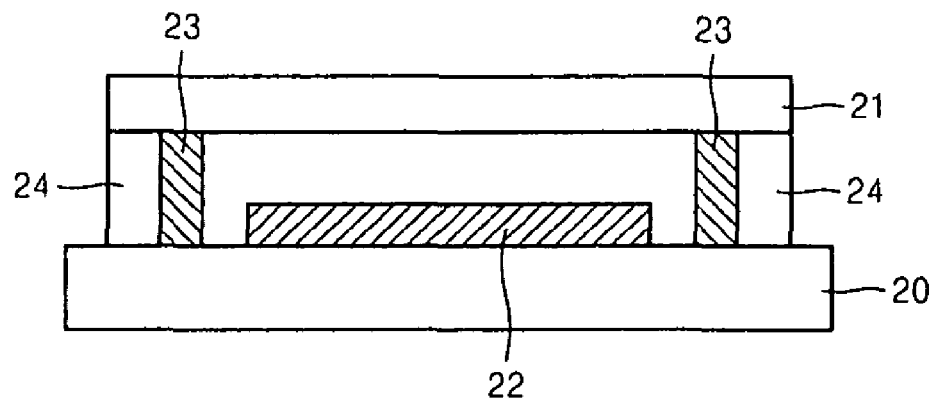

Referring to FIG. 2, transparent moisture absorption layers 23 are formed on side surfaces of sealant layers or side walls 24 of the structure. In FIG. 2, reference numerals 20, 21, and 22 denote a substrate, an encapsulation substrate, and an organic light emitting unit, respectively.

Referring to FIG. 3, an encapsulation substrate 31 is coupled with a substrate 30 similar to FIGS. 1 and 2, in which a space is enclosed by the two substrates and side walls. One or more recessed portions 35 are formed in the encapsulation substrate 31. Transparent moisture absorption layers 33 are formed in the recessed portions 35. In FIG. 3, reference numeral 32 refers to an array of organic light emitting units. The numeral 34 denotes an interconnection between the substrates 30 and the side walls. The interconnection may be a sealant layer.

Referring to FIG. 4, an encapsulation layer 41 is formed of planar glass, and a transparent moisture absorption layer 43 is formed on an inner surface of the encapsulation substrate 41. In FIG. 4, reference numerals 40, 42, and 44 denote a substrate, an array of organic light emitting units, and side walls. The side walls may be formed of a sealant.

In the illustrated embodiments, the transparent moisture absorption layers 13, 23, 33, and 43 may be a layer containing transparent nano-size CaO. The organic light emitting units 12, 22, 32, and 42 may be formed using a number of different deposition techniques. The organic light emitting units 12, 22, 32, and 42 include a first electrode, one or more organic layers, and a second electrode. The first electrode may act as a cathode, and the second electrode may act as an anode. The organic layers include an emissive or light-emitting layer, and optionally a hole injection layer, a hole transport layer, an electron injection layer and/or an electron transport layer.

The encapsulation substrates 11, 21, 31, and 41 may be formed of an insulating material, such as glass or transparent plastic. When the encapsulation substrates 11, 21, 31, and 41 are plastic substrates, protective layers may be formed on inner surfaces of the plastic substrates to protect the plastic substrates from moisture or other eroding materials or conditions. The protective layers may be heat resistant, chemical resistant, and water repellent. An encapsulation substrate formed of a transparent material as described above can be used in a top (or front) emission type or a bottom (or rear) emission type organic light emitting display devices.

For a bottom emission type organic light emitting display device, the organic light emitting units 12, 22, 32, and 42 have a transparent electrode between the emissive layer and the substrate 10, 20, 30, 40. For a top emission type organic light emitting display device, the organic light emitting units 12, 22, 32, and 42 have a transparent electrode over the emissive layer.

In order to provide heat resistance, chemical resistance, and water repellence to an upper surface of the second electrode, protective layers formed of an inorganic material capable of planarizing upper surfaces of the organic light emitting units 12, 22, 32, and 42 may be further included. The protective layers may be formed of metal oxide or metal nitride.

The inner space defined or enclosed by the encapsulation substrates 11, 21, 31, and 41 and the substrates 10, 20, 30, and 40 may be maintained in a vacuum state or filled with an inert gas. Further, the enclosed space is substantially water-impermeably sealed although not such sealing can be perfect and some permeation of moisture from the outside into the enclosed space is possible.

The transparent moisture absorption layers 13, 23, 33, and 43 may be thick, as long as their transparent property is maintained. The thicknesses of the transparent moisture absorption layers 13, 23, 33, and 43 may be in the range of about 0.1 to about 300 μm. For example, when an encapsulation substrate is formed of etched glass as illustrated in FIG. 1, the thickness of the transparent moisture absorption layer 13 may be in the range of about 0.1 to about 300 μm. When an encapsulation substrate is formed of planar glass, the thicknesses of the transparent moisture absorption layers may be in the range of about 0.1 to about 70 μm.

An exemplary method of manufacturing an organic light emitting display device including the transparent moisture absorption layer described above will now be described. On a substrate 10, 20, 30, 40, an array of organic light emitting units including various circuitries to run the organic light emitting units is fabricated. Then, a composition for the transparent moisture absorption layer is prepared by mixing, for example, a solvent, a binder, a selective light absorber, and at least one of a metal oxide and a metal salt. The composition may further include a dispersant when needed. In order to increase dispersibility and uniformity, the method may further include preparing a first mixed solution by mixing a solvent and at least one of a metal oxide and a metal salt, separately preparing a second mixed solution by dissolving a selective light absorber in a solvent, and mixing a binder and a dispersant in the mixture of the first mixed solution and the second mixed solution.

The composition is then coated on an inner surface of the encapsulation substrate, dried, and cured to produce a transparent moisture absorption layer. Here, the coating may be performed by dip coating, spin coating, spray coating, dispensing, screen printing, or ink jet printing. When the transparent moisture absorption layer is formed using the printing method described above, the binder and the solvent of the transparent moisture absorption forming composition may act as a vehicle to retain the fluidity of the composition for printing. The viscosity of the transparent moisture absorption layer forming composition may be in the range of about 500 to about 50,000 cps.

The heat curing process may be performed using heat or ultraviolet (UV) rays. The heat curing process may be performed at a temperature of about 100 to about 250□. The amount of the binder may be in the range of about 10 to about 5000 parts by weight based on 100 parts by weight of the desiccant. The amount of the dispersant may be in the range of about 1 to about 100 parts by weight based on 100 parts by weight of the desiccant.

The solvent may be any solvent that can disperse the desiccant, more particularly, metal oxide or the metal salt. The solvent may contain at least one material selected from the group consisting of ethanol, methanol, propanol, butanol, isopropanol, methylethylketone, pure water, propyleneglycol, 1-metoxy 2-propanol (PGM), isopropylcellulose (IPC), methyl cellosolve (MC), and ethyl cellosolve (EC). The amount of the solvent may be in the range of about 100 to about 1900 parts by weight based on 100 parts by weight of the desiccant.

As described above, in some embodiments, a transparent moisture absorption layer contains a selective light absorber that absorbs light of a wavelength of a specific region to improve color purity and contrast characteristics of a top emission type organic light emitting display device to which the transparent moisture absorption layer is applied. The transparent moisture absorption layer may have a thickness of about 0.1 to about 300 μm and desired moisture absorption and oxygen adsorbing characteristics. Therefore, the transparent moisture absorption layer can reduce the possibility of erosion by moisture or oxygen to any sensitive parts of the organic light emitting display device.

According to certain embodiments, the transmissivity of the transparent moisture absorption layer may be in the range of 95 to 98%. Other embodiments, the transparent moisture absorption layer is substantially transparent with respect to visible light. Here, substantial transparency of the visible light refers to transmissivity over about 70, 71, 72, 73, 74, 75, 76, 77, 78, 79, 80, 82, 83, 84, 85, 86, 87, 88, 89, 90, 91, 92, 93, 94, 95, 96, 97, 98 or 99% of visible light incident to the transparent moisture absorption or desiccant layer. In embodiments, the moisture absorption rate of the transparent moisture absorption layer may be in the range of 30-50%.

When the transparent moisture absorption layer has a thickness of 100-300 μm, the transmissivity may be about 95% or greater, for example, in the range of 96-98%; the moisture absorption rate is in the range of 30-40%; and a haze is 1.0 or less, for example, in the range of 0.2 to 0.8.

After a substrate and the transparent moisture absorption layer on the substrate are prepared as described above, a sealant is coated on at least one side of the substrate and an encapsulation substrate outside an organic light emitting unit using a number of different techniques, including a screen printer or dispenser. Then, the encapsulation substrate is substantially hermetically coupled with the substrate to produce an organic light emitting display device according to an embodiment of the present invention. In addition, an inner or enclosed space of the organic light emitting display device manufactured as described above may be evacuated or filled with an inert gas. Furthermore, after the substrate is coupled with the encapsulation substrate, the sealant may be cured using ultraviolet rays, visible rays, or heat.

The transparent moisture absorption layer obtained as described above may retain its transparency before and after absorbing moisture. An organic light emitting display device according to an embodiment of the present invention may be used in a top emission type organic light emitting display device, a rear emission type organic light emitting display device, or a both-direction emission type organic light emitting display device. The operating method of an organic light emitting display device according to an embodiment of the present invention is not limited. For example, the operating method may be a passive matrix (PM) type operating method or an active matrix (AM) type operating method.

The present invention will be described in further detail with reference to the following examples. These examples are provided for illustrative purposes only and are not intended to limit the scope of the present invention.

Example 1

100 parts by weight of anhydrous calcium oxide (CaO) (average diameter of 30 nm), and 10 parts by weight of epoxycyclohexyltrimethoxysilane, which is organic and inorganic complex siloxane used as a dispersant, were mixed in 400 parts by weight of anhydrous ethanol and the result was milled for 24 hours, thereby producing a dispersing solution having an average diameter of about 70 nm. Then, 3000 parts by weight of urethane acrylate used as an organic binder, and 10 parts by weight of pyromethen 546 having an average diameter of about 40 nm used as a selective light absorber were mixed with the resultant dispersing solution to prepare a composition for a transparent moisture absorption layer.

The composition was printed on etched glass, and then the printed result was heat treated at 100☐ and cured using ultraviolet rays to produce a transparent moisture absorption layer. An epoxy resin as a sealant was coated on the soda glass substrate on which the transparent moisture absorption layer was formed and a glass substrate on which a first electrode, an organic layer, and a second electrode were formed. Then, the soda glass substrate was coupled with the glass substrate to produce an organic light emitting display device.

Example 2

An organic light emitting display device was produced in the same manner as in Example 1, except that DODCI was used instead of pyromethen 546.

Example 3

A conventional getter (HD-204 available from Dynic Inc. Japan) was installed on a soda glass substrate. An epoxy resin as a sealant was coated on the soda glass substrate and on a glass substrate on which a first electrode, an organic layer, and a second electrode were formed. Then, the soda glass substrate was coupled with the glass substrate to produce an organic light emitting display device.

Example 4

CaO particles having a primary particle diameter of about 70 nm were mixed with polyethylmethacrylate (PEMA) as an organic binder. The resulting solution was printed on etched glass and cured to produce a moisture absorption layer.

An epoxy resin as a sealant was coated on the soda glass substrate on which the moisture absorption layer was formed and on a glass substrate on which a first electrode, an organic layer, and a second electrode were formed. Then, the soda glass substrate was coupled with the glass substrate to produce an organic light emitting display device.

Example 5

Color purity and contrast characteristics of the organic light emitting display devices according to Examples 1-4 were measured. The organic light emitting display devices according to Examples 1 and 2 exhibited better color purity and contrast characteristics than the organic light emitting display devices according to Examples 3 and 4.

In addition, the moisture absorption rate and transmissivity of the organic light emitting display devices according to Examples 1-4 were measured. The transparent moisture absorption layers according to Examples 1 and 2 exhibited better moisture absorption capability with a greater moisture absorption rate than the getter as the moisture absorption agent.

The transmissivity of the transparent moisture absorption layers according to Examples 1 and 2 were 95% or higher, which is suitable for a top emission type organic light emitting display device. On the other hand, the transmissivity of the moisture absorption layers according to Example 4 was about 85% and more haze was detected. In Example 4, although CaO particles had a primary particle diameter of 70 nm, some of the CaO particles may have aggregated together due to an attractive electrostatic force.

An organic light emitting display device including a transparent moisture absorption layer according to the present invention has an excellent moisture absorption capability compared to a conventional organic light emitting display device including a getter, and is transparent so as to be suitable for a top emission type organic light emitting display device. Therefore, the organic light emitting display device can have desired lifetime characteristics and improved color purity and contrast characteristics.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A light emitting display device comprising:
a first substrate having a first interior surface;
an array of light emitting units formed on the first interior surface, the array having a top surface facing away from the first substrate;
a second substrate placed over the first substrate and the array, the second substrate having a second interior surface, which faces the first substrate; and
a desiccant layer placed between the first and second substrates, the desiccant layer comprising a desiccant, a binder, a selective light absorber, and a dispersant, wherein the desiccant comprises at least one of a metal oxide and a metal salt, wherein the at least one of the metal oxide and the metal salt is in a particulate form having an average particle diameter of about 100 nm or less, wherein the dispersant ranges from about 1 to about 100 parts by weight based on 100 parts by weight of the desiccant, and wherein the desiccant, binder, selective light absorber and dispersant are selected such that the desiccant is configured to be substantially transparent with respect to visible light;
wherein the selective light absorber comprises at least one compound selected from the group consisting of a porphyrin-based compound, a pyromethene-based compound, a satural absorber phenothiazine-based compound and an azaporphyrin-based compound.

2. The device of claim 1, wherein the selective light absorber selectively absorbs light of a wavelength of 410 nm or 490 nm, or one or more wavelengths within the range of 570-590 nm.

3. The device of claim 1, wherein the selective light absorber has in a particulate form having an average particle diameter from about 30 to about 50 nm.

4. The device of claim 1, wherein the amount of the selective absorber is in the range of from about 0.1 to about 200 parts by weight based on 100 parts by weight of the desiccant.

5. A light emitting display device comprising:
a first substrate having a first interior surface;
an array of light emitting units formed on the first interior surface, the array having a top surface facing away from the first substrate;
a second substrate placed over the first substrate and the array, the second substrate having a second interior surface, which faces the first substrate; and
a desiccant layer placed between the first and second substrates, the desiccant layer comprising a desiccant, a binder, a selective light absorber, and a dispersant;
wherein the desiccant comprises at least one of a metal oxide and a metal salt, wherein the at least one of the metal oxide and the metal salt is in a particulate form having an average particle diameter of about 100 nm or less, wherein the desiccant layer is substantially transparent with respect to visible light, wherein the dispersant ranges from about 1 to about 100 parts by weight based on 100 parts by weight of the desiccant, and wherein the selective light absorber comprises at least one compound selected from the group consisting of a porphyrin-based compound, a pyromethene-based compound, a satural absorber phenothiazine-based compound and an azaporphyrin-based compound.

6. The device of claim 1, wherein the desiccant layer is formed on at least one of the second interior surface and the top surface with or without an intervening material between the desiccant and the second interior surface or between the desiccant and the top surface.

7. The device of claim 1, wherein the desiccant layer is arranged in a location such that at least part of light emitted from the array pass through the desiccant layer.

8. The device of claim 1, wherein the array of light emitting units comprises a plurality of organic light emitting diodes, wherein each organic light emitting diode comprises a first electrode, a second electrode and an emissive layer located between the first and second electrodes, and wherein at least one of the first and second electrodes is substantially transparent.

9. The device of claim 1, further comprising a plurality of side walls interconnecting with the first and second substrates, wherein the desiccant layer is formed on one or more of the plurality of side walls.

10. The device of claim 1, wherein the at least one of the metal oxide and the metal salt comprises at least one selected from the group consisting of alkali metal oxides, alkali-earth metal oxides, metal halides, metal sulfates and metal perchlorates.

11. The device of claim 1, wherein the metal oxide comprises CaO.

12. The device of claim 1, wherein the desiccant layer comprises the dispersant in an amount sufficient to substantially uniformly disperse the desiccant within the desiccant layer.

13. The device of claim 1, wherein the desiccant layer further comprises at least one binder selected from the group consisting of an organic binder, an inorganic binder, and an organic/inorganic complex binder, and the at least one binder is in an amount from about 10 to about 5000 parts by weight based on 100 parts by weight of the desiccant.

14. The device of claim 1, wherein the desiccant layer has a thickness from about 0.1 to about 300 μm.

15. The device of claim 1, wherein the desiccant layer transmits over about 90% of visible light incident thereto.

16. The device of claim 1, wherein the desiccant layer transmits from about 95 to about 98% of visible light incident thereto.

17. The device of claim 1, wherein the desiccant layer absorbs moisture at a rate from about 30 to about 50%.

18. A method of manufacturing a light emitting display device, the method comprising;
providing a first substrate having a first interior surface;
forming an array of organic light emitting units on the first interior surface, the array having a top surface facing away from the first substrate;
placing a second substrate over the first substrate and the array, the second substrate having a second interior surface, which faces the first substrate;
interconnecting the first and second substrates with a plurality of side walls, thereby forming an enclosed space; and
prior to interconnecting, forming a desiccant layer in a place to be enclosed within the enclosed space, the desiccant layer comprising a desiccant, a binder, a selective light absorber, and a dispersant, wherein the desiccant comprises at least one of a metal oxide and a metal salt, wherein the at least one of the metal oxide and the metal salt is in a particulate form having an average particle diameter of about 100 nm or less, and wherein the dispersant ranges from about 1 to about 100 parts by weight based on 100 parts by weight of the desiccant;

selecting the desiccant, binder, selective light absorber and dispersant so that the desiccant layer is made substantially transparent with respect to visible light;
wherein the selective light absorber comprises at least one compound selected from the group consisting of a porphyrin-based compound, a pyromethene-based compound, a satural absorber phenothiazine-based compound and an azaporphyrin-based compound.

19. The method of claim 18, wherein the desiccant layer further comprises a selective light absorber selectively absorbing light of a wavelength of 410 nm or 490 nm, or a wavelength within the range of 570-590 nm.

20. A method of displaying a visible image, comprising:
providing a light emitting display device comprising:
a first substrate having a first interior surface,
an array of light emitting units formed on the first interior surface, the array having a top surface facing away from the first substrate,
a second substrate placed over the first substrate and the array, the second substrate having a second interior surface, which faces the first substrate, and
a desiccant layer placed between the first and second substrates, the desiccant layer comprising a desiccant, a binder, a selective light absorber, and a dispersant, wherein the desiccant comprises at least one of a metal oxide and a metal salt, wherein the at least one of the metal oxide and the metal salt is in a particulate form having an average particle diameter of about 100 nm or less, wherein the dispersant ranges from about 1 to about 100 parts by weight based on 100 parts by weight of the desiccant, and wherein the desiccant, binder, selective light absorber and dispersant are selected such that the desiccant is configured to be substantially transparent with respect to visible light; and
stimulating the device to emit visible light from at least part of the light emitting units, thereby displaying a visible image on at least one of the first and second substrates;
wherein the selective light absorber comprises at least one compound selected from the group consisting of a porphyrin-based compound, a pyromethene-based compound, a satural absorber phenothiazine-based compound and an azaporphyrin-based compound.

21. The method of claim 20, wherein at least part of the visible light emitted from the at least part of the light emitting units passes through the desiccant layer.

22. The method of claim 21, wherein the visible image is displayed on the second substrate.

23. The light emitting display device of claim 1, wherein the at least one of the metal oxide and the metal salt is in a particulate form having an average particle diameter of about 30 nm to 90 nm.

24. The method of manufacturing the light emitting display device of claim 18, wherein the at least one of the metal oxide and the metal salt is in a particulate form having an average particle diameter of about 30 nm to 90 nm.

25. The method of displaying a visible image of claim 20, wherein the at least one of the metal oxide and the metal salt is in a particulate form having an average particle diameter of about 30 nm to 90 nm.

26. The device of claim 1, wherein the dispersant is selected from the group consisting of a low molecular weight organic dispersant, a high molecular weight organic dispersant, a low molecular weight organic/inorganic complex dispersant, a high molecular weight organic/inorganic complex dispersant, and an organic/inorganic acid.

27. A light emitting display device comprising:
a first substrate having a first interior surface;
an array of light emitting units formed on the first interior surface, the array having a top surface facing away from the first substrate;
a second substrate placed over the first substrate and the array, the second substrate having a second interior surface, which faces the first substrate; and
a desiccant layer placed between the first and second substrates, the desiccant layer comprising a desiccant, a binder, a selective light absorber, and a dispersant;
wherein the desiccant comprises at least one of a metal oxide and a metal salt, wherein the at least one of the metal oxide and the metal salt is in a particulate form having an average particle diameter of about 100 nm or less, wherein the desiccant layer is substantially transparent with respect to visible light, wherein the dispersant ranges from about 1 to about 100 parts by weight based on 100 parts by weight of the desiccant; and wherein the dispersant comprises an organic and inorganic complex siloxane;
wherein the selective light absorber comprises at least one compound selected from the group consisting of a porphyrin-based compound, a pyromethene-based compound, a satural absorber phenothiazine-based compound and an azaporphyrin-based compound.

28. The device of claim 1, wherein the dispersant comprises epoxycyclohexyltrimethoxysilane.

29. The method of claim 18, wherein the dispersant is selected from the group consisting of a low molecular weight organic dispersant, a high molecular weight organic dispersant, a low molecular weight organic/inorganic complex dispersant, a high molecular weight organic/inorganic complex dispersant, and an organic/inorganic acid.

30. The method of claim 20, wherein the dispersant is selected from the group consisting of a low molecular weight organic dispersant, a high molecular weight organic dispersant, a low molecular weight organic/inorganic complex dispersant, a high molecular weight organic/inorganic complex dispersant, and an organic/inorganic acid.

* * * * *